United States Patent [19]

Alsup et al.

[11] 3,775,112

[45] Nov. 27, 1973

[54] PHOTOPOLYMERIZABLE MATERIAL CONTAINING STARCH AND PROCESS OF USING

[75] Inventors: Michael J. Alsup; Alec N. Mutz, both of Rochester, N.Y.

[73] Assignee: Eastman Kodak Company, Rochester, N.Y.

[22] Filed: June 10, 1971

[21] Appl. No.: 151,984

[52] U.S. Cl. .................... 96/28, 96/115, 204/159.11

[51] Int. Cl. .............................................. G03c 5/04

[58] Field of Search ...................... 96/28, 115 P, 35; 204/159.11; 260/9

[56] References Cited

UNITED STATES PATENTS 3,202,508 8/1965 Heiart .................................... 96/28

FOREIGN PATENTS OR APPLICATIONS 1,091,311 11/1967 Great Britain 816,016 6/1969 Canada

*Primary Examiner*—Norman G. Torchin

*Assistant Examiner*—R. L. Schilling

*Attorney*—Robert W. Hampton, James R. Frederick and Joshua G. Levitt

[57] ABSTRACT

A photosensitive element useful in transfer processes for the preparation of images, in particular multilayer images such as color proofs, contains in the light sensitive layer small, irregular-shaped particles, such as corn starch.

5 Claims, No Drawings

PHOTOPOLYMERIZABLE MATERIAL CONTAINING STARCH AND PROCESS OF USING

This invention relates to the photographic reproduction of images. In a particular aspect it relates to elements useful for the preparation of multicolor images by processes involving a transfer step and to processes of preparing such images.

In recent years light sensitive polymers and light sensitive polymer compositions have found widespread acceptance for use in photographic reproduction processes. In a typical procedure, a layer of the light sensitive polymer composition is exposed to actinic radiation to create a differential between the exposed and unexposed areas of the layer such as a difference in solubility or melting point. This difference between the exposed and unexposed areas of the layer forms the basis for developing an image in accordance with the exposure of the element to actinic radiation.

Differences in solubility were first used to develop images, but in recent years there has been increased interest in, and wider acceptance of processes which utilize for development of an image the differences in softening or tackifying point between the exposed and unexposed areas of the layer. Such photothermographic processes are particularly attractive since they eliminate the need for solvents or other wet chemical processing steps. Typical of these processes are those described in Allen U.S. application Ser. No. 709,496, filed Feb. 29, 1968, now U.S. Pat. No. 3,622,370, issued Nov. 23, 1971.

This process utilizes the difference in tackifying point between the exposed and unexposed areas of a layer to develop an image and involves heating the imagewise exposed element and transferring composition from the lower melting areas of the element to a receptor surface. Optical density is given to the transferred image by incorporating in the light sensitive polymer layer a pigment or dye.

The present invention provides novel photosensitive elements useful in such transfer processes.

It is an object of this invention to provide novel photosensitive elements.

It is a further object of this invention to provide novel photothermographic elements which exhibit low tackiness, thus obviating the need for interleaving paper between elements in a stack or convolutions of coated rolls.

It is still a further object of this invention to provide novel photothermographic elements which can be used to prepare multilayer images.

It is yet a further object of this invention to provide novel photothermographic elements which give multilayer transfer images having improved additivity of reflection densities of overlaying color images.

It is another object of this invention to provide novel photothermographic processes for preparing images.

The above and other objects of this invention will become apparent to those skilled in the art from the further description of the invention which follows.

In accordance with the present invention we have found that an improved light sensitive element, having particular utility for the preparation of multicolor, multilayer images by a photothermographic transfer process, comprises a support bearing a light sensitive polymer composition containing certain dry powders having irregular-shaped particles, in particular, corn starch.

The photothermographic transfer elements of the present invention exhibit low tackiness, improved additivity of reflection transfer densities of multicolor images and increased light scatter in comparison with similar elements which omit particles such as corn starch from the light sensitive polymer coating composition used to prepare the element. The low tackiness eliminates the need for interleaving paper between convolutions of a roll of the element or individual elements in a stack and prevents the convolutions or elements from sticking to one another. The improved additivity of reflection densities provides multicolor images of improved sharpness and density and color reproduction. Good additivity of print reflection densities of a multicolor print is obtained when the green absorption of a blue image is substantially equal to the sum of the green absorptions of the magenta and cyan images which make up the blue image, the blue absorption of a red image is substantially equal to the sum of the blue absorptions of the yellow and magenta images which make up the red image, etc. Increased light scattering within the polymer layer increases the probability of the light striking a photoreactive site in the layer and hence increases the photographic speed of the layer.

While small particles such as corn starch have been used previously as matting agents for coated papers to prevent the face of one sheet from sticking to the back of an adjacent sheet, we have found that, unlike corn starch, particles such as methyl-methacrylate beads, calcium carbonate and the like have an adverse effect on the reflection density of transferred images, giving images of lower density than a control coating from which the small particles are omitted. Furthermore, it is unexpected that an increase in additivity of transfer reflection density would be obtained with small particles such as corn starch.

The powders containing small irregular-shaped particles which are useful in the present invention are materials such as corn starch. Preferably they are insoluble in the organic solvents for the polymer used in coating, compatible with the light sensitive component of the composition and have an average particle diameter of about two to 50 microns, with the major portion of the particles having a diameter of three to 15 microns. Good results are obtained when corn starch is employed in the composition in amount of 0.1 to 25 percent by weight based on the weight of the light sensitive polymer. Preferably, it is employed in amount of about 1.0 to 15 percent by weight based on the weight of the polymer. Without this range, with single layer coatings amounts toward the lower end of the range are preferred, while with two layer coatings, as described in our U.S. application Ser. No. 112,464, filed Feb. 3, 1971 now abandoned, amounts towards the upper end of the range are preferred.

A wide number of light sensitive polymers and polymer compositions can be used in the light sensitive elements of this invention. The light sensitive polymers generally contain the light sensitive grouping $$-CH=CH-\overset{\overset{\displaystyle O}{\|}}{C}-$$

in the polymer, either as an integral part of the polymer backbone or in a group attached to the polymer backbone. Typical suitable polymers include normally solid, film-forming polyesters and polycarbonates. Representative polymers containing this light sensitive grouping are described for example in such patents as Michiels et al. U.S. Pat. No. 2,956,878, issued Oct. 18, 1960, Schellenberg et al U.S. Pat. No. 3,030,208, issued Apr. 17, 1962, and Borden et al. U.S. Pat. No. 3,453,237 issued July 1, 1969 as well as such U.S. Pat. applications as Allen U.S. Ser. No. 709,496, filed Feb. 29, 1968 now U.S. Pat. No. 3,622,370, issued Nov. 23, 1971, Philpot et al. U.S. Ser. No. 19,063 filed Mar. 12, 1970 now abandoned and Laakso et al U.S. Ser. No. 19,064 filed Mar. 12, 1970 now abandoned. Certain of these polymers have suitable thermo-mechanical properties for use in transfer processes without addition of other components to modify the physical properties of the light sensitive layers prepared from them. Others of these polymers require the presence of additional components, such as plasticizers and the like, to impart to the layer in which they are contained suitable physical properties for use in transfer processes. Such modifications can be made by those skilled in the art in accordance with known procedures.

Particularly preferred for use in the elements of the present invention are the polyester compositions described in Allen U.S. Ser. No. 709,496, filed Feb. 29, 1968 now U.S. Pat. No. 3,622,370, issued Nov. 23, 1971. Such light sensitive compositions are substantially non-tacky at room temperature (20° C), but have tackifying temperatures (i.e., the temperature at which the composition becomes sensually tacky) of about 50° to 200° C. Typically, these photocrosslinkable polyester compositions have a crystallinity of about 10 percent to 80 percent as determined by x-ray diffraction, and a glass transition temperature (Tg) of less than about 30° C., glass transition temperature being that temperature at which the composition in molten state changes to a hard glass state. Suitable polyesters are prepared with 50 mole percent of at least one dihydric alcohol or diol moiety and 50 mole percent of at least two hydroxy-free dicarboxylic acid moieties, about 5 to 45 mole percent, based on the polyester, of the dicarboxylic acid moieties containing as an integral portion a light-sensitive grouping $$-CH=CH-\overset{O}{\overset{\|}{C}}-$$

On exposure to actinic radiation these polyesters crosslink to form in the areas of exposure, material having a higher tackifying temperature than the original or unexposed polyester.

A wide variety of diols can be utilized in preparing these light-sensitive polyesters. Typical of the suitable diols are those having the formula HO-R-OH wherein R is a divalent organic radical generally having about two to 12 carbon atoms, including carbon and hydrogen atoms as well as ether oxygen atoms, e.g., 1) a hydrocarbon radical such as an alkylene radical, a cyclohexane radical, a 1,4-dimethylenecyclohexane radical, a phenylene radical, a 1,4-dialkylenecyclohexane radical, a 2,2-dimethylpropylene radical or the like; 2) an -alkylene-0-alkylene radical; 3) an -alkylene-0-cyclohexane-0-alkylene-radical; and the like. Exemplary diols that can be utilized in preparing these polyesters include: ethylene glycol, diethylene glycol, 1,3-propane diol, 1,4-butane diol, 1,5-pentane diol, 1,6-hexane diol, 1,7-heptane diol, 1,8-octane diol, 1,9-nonane diol, 1,10-decane diol, 1,12-dodecane diol, neopentyl glycol, 1,4-cyclohexanedimethanol, and 1,4-di-β-hydroxyethoxycyclohexane. Mixtures of such diols can also be used in preparing these polyesters.

One of the dicarboxylic acids (5 to 45 mole percent of the polyester) utilized in combination with the diols in preparing these polyesters contains the light-sensitive moiety $$-CH=CH-\overset{O}{\overset{\|}{C}}-$$

Particularly useful dicarboxylic acids are those with light-sensitive moieties having the formula $$-R'-CH=CH-\overset{O}{\overset{\|}{C}}-$$

wherein R′ is a divalent aryl radical such as phenylene or naphthylene, typical of such dicarboxylic acids being *p*-phenylene diacrylic acid. Another typical useful dicarboxylic acid having this light-sensitive moiety is fumaric acid.

The dicarboxylic acid containing the light-sensitive moiety is useful in combination with at least one additional dicarboxylic acid free of such light-sensitive moiety which is employed to substantially modify the properties of the polyester to permit its use in photothermographic transfer processes. Such modifying dicarboxylic acids can be represented by the formula:

$$HO\overset{O}{\overset{\|}{C}}-R''-\overset{O}{\overset{\|}{C}}OH$$

wherein R″ is a divalent organic radical generally having about two to 12 carbon atoms including such hydrocarbon radicals as, 1) an alkylene radical; 2) a carbocyclic radical such as phenylene, and the like. Exemplary dicarboxylic acids that can be utilized in combination with the dicarboxylic acid containing the light-sensitive moiety for preparing these polyesters include: malonic acid, succinic acid, glutaric acid, adipic acid, pimelic acid, suberic acid, azelaic acid, sebacic acid, dode-canedioic acid, brassylic acid, α, β-diethylsuccinic acid, α-butyl-α-ethyl glutaric acid, terephthalic acid, and isophthalic acid. Mixtures of such dicarboxylic acids can also be used in preparing the polyesters.

These polyesters can be prepared by esterifying a diol and a mixture of dicarboxylic acids of the type described above. Typically, the dicarboxylic acid reactants are in the form of esters of lower monohydric alcohols such as methyl, ethyl, *n*-propyl, *n*-butyl, isobutyl, isoamyl and the like. The reaction can be suitably effected in the presence of an inter-esterification catalyst such as a tetraalkyl titanate at an elevated temperature in an organic solvent in accordance with usual practice.

Suitable pigments which can be employed in the coatings of the present invention include azo pigments such as monoazo pigments and disazo pigments, phthalocyanine pigments such as copper phthalocyanine pigments, anilide pigments, azine pigments, xanthene pigments, inorganic pigments such as carbon blacks like channel blacks and furnace blacks, and the like. Representative of such pigments are Color Index Pigment Yellow 1 (CI No. 11680), Color Index Pigment Yellow 12 (CI No. 21090), Color Index Pigment Yellow 14 (CI No. 21095), Color Index Pigment Red 57 (CI No. 15850), Color Index Pigment Red 81 (CI No. 45160), Color Index Pigment Blue 15 (CI No. 74160), Color Index Pigment Black 1 (CI No. 50440) and Color Index Pigment Black 7 (CI No. 77266). These pigments can be flocculated by the procedure described in Gramza and Schreiber U.S. application Ser. No. 45,219, filed June 10, 1970 now U.S. Pat. No. 3,671,240 to give the discontinuous structure described therein.

In preparing the coating composition used in the present invention, suitable solvents can be selected from those organic solvents generally employed to prepare polymer coatings. Representative solvents include ketones such as 2-butanone, 4-methyl-2-pentanone, cyclohexanone, 4-butyrolactone, 2,4-pentandione, 2,5-hexanedione, etc.; esters such as 2-ethoxyethyl acetate, 2-methoxyethyl acetate, *n*-butyl acetate, etc.; chlorinated solvents such as chloroform, dichloroethane, trichloroethane, tetrachloroethane, etc.; as well as dimethylformamide and dimethylsulfoxide; and mixtures of these solvents.

Typically the light sensitive polymer is employed in the coating composition in amount of about from one to 20 percent by weight, based on the weight of the total composition. Preferably the polymer comprises about two to 10 percent by weight of the composition in a solvent as listed above. Typically the pigment is present in the coating composition used to prepare the pigmented layer in amount of about from 0.5 to five percent by weight, based on the weight of the total composition. Preferably, the pigment in the pigmented layers comprises five to 50 percent by weight of the light sensitive polymer.

The light sensitive polymers employed in this invention are compatible with, and the effectiveness of their operation can be enhanced by known photographic addenda such as sensitizers and the like. For example, the preferred light sensitive compositions described in the above mentioned Allen U.S. Ser. No. 709,496 can be sensitized with such materials as 6-methoxy-β-2-furyl-2-acrylonaphthone, Michler's ketone, Michler's thioketone, quinolizone, 2-chloroanthraquinone, 2,6-bis(p-azido-benzal)-4-methylcyclohexanone, thiazoles, pyrylium salts, thiapyrylium salts and the like sensitizers to obtain highly sensitized photothermographic compositions. Typical suitable sensitizers are described in French Pats. 1,086,257 and 1,089,290 and U.S. Pat. Nos. 2,610,120, 2,690,966, 2,670,285, 2,670,286, 2,670,287 and 2,732,301.

The coating compositions also can include other known photographic addenda utilized for their known purpose; such as agents to modify the flexibility of the coating, agents to modify the adhesivity of the coating to the support, antioxidants, preservatives, surfactants as well as other addenda known to those skilled in the art. These addenda can be incorporated in the coating compositions used to prepare either or both of the layers.

The light sensitive polymer can be the sole polymeric constituent of the coating composition or another polymer can be incorporated therein to modify the physical properties of the composition and serve as a diluent.

These and other polymeric materials can constitute up to 25 percent by weight, based on the weight of the light sensitive polymer, of the coating composition.

Suitable support materials onto which the coating composition can be coated to prepare the light sensitive elements of the present invention include fiber base materials such as paper, polyethylene-coated paper, polypropylene-coated paper, cloth, etc.; sheets and foils of such metals as aluminum, copper, magnesium, zinc, etc.; synthetic polymeric materials such as poly(alkyl methacrylates), e.g., poly(methyl methacrylate), polyester film base, e.g., poly(ethylene terephthalate), poly-(vinyl acetals), polyamides, e.g., nylon, cellulose ester film base, e.g., cellulose nitrate, cellulose acetate, cellulose acetate propionate, cellulose acetate butyrate, and the like. The optimum coating thickness for a particular purpose will depend upon such factors as the particular light sensitive polymer employed, and the nature of other components which may be present in the coating. Typically the compositions are coated on the support at a rate of between about 0.1 and 1.0 grams per square foot. This will give dry coating thicknesses which are useful for most image reproduction processes. However, for particular applications, the compositions can be applied at a rate which will give thicker or thinner coatings. Conventional coating techniques, such as flow coating, hopper coating, dip coating, whirl coating and the like can be used to prepare the elements of this invention. Alternatively, the procedures can be used such as are described in Alsup and Mutz copending application Ser. No. 112,464 filed Feb. 3, 1971, now abandoned, entitled PHOTOSENSITIVE ELEMENTS AND PROCESSES which result in elements wherein the portion of the light sensitive polymer composition adjacent the support is substantially unpigmented and the remaining portion of the light sensitive polymer composition contains a pigment.

Photographic images are prepared by photothermographic transfer processes in accordance with the present invention by imagewise exposing the element to actinic radiation to crosslink the light sensitive polymer in the exposed areas and raise the tackifying temperature of the composition in those areas. The exposed element is then heated to a temperature intermediate between the tackifying temperature of the composition in the exposed and unexposed areas of the layer to selectively render tacky the composition in the unexposed areas. The temperature to which the element is heated will gradually be in the range of 50° to 200° C. The tackified composition is then transferred to a receptor surface, which can be a material similar to that used for the support.

Both transmission exposures and reflex exposures can be employed to expose the photosensitive elements. In processes using reflex exposures, the element is placed in contact with an original and light is passed from the source through the element to the original. In the image areas of the original, the light is absorbed and in the nonimage areas it is reflected back, thus further exposing the light sensitive composition. Right reading or laterally reversed images can be obtained depending upon whether the back or the front of the light sensitive element is in contact with the original. Suitable light sources which can be employed in the exposure of the element include sources rich in visible radiation and sources rich in ultraviolet radiation, such as carbon arc lamps, mercury vapor lamps, fluorescent lamps, tungsten lamps, photoflood lamps and the like.

The heating and transfer operation is typically carried out substantially simultaneously by placing the imagewise exposed layer of the element in contact with a receiving sheet, passing the sandwich so formed between a pair of heated pressure rollers and then separating the element from the receiving sheet which now carries the transferred image. In general these rollers preferably comprise one metal roll such as an aluminum or stainless steel roll, and one resilient roll, such as a rubber roll having a steel core. The heating of the rollers can be by means of internal heating in the metal roll or external heating or a combination of both. The temperature of the rollers is typically held within five degrees of the desired transfer temperature. The force with which the rolls are loaded can be widely varied in accordance with usual practice, although loading forces of at least about 10 pounds per linear inch of roll are generally used, with loading forces up to 50 pounds per linear inch being suitable.

Other suitable apparatus for effecting transfer of the image is described in Kodak Belgian Pat. No. 742,431, granted Jan. 30, 1970. This apparatus comprises a modified flat bed letter press printing press wherein the bed is heated and the carriage which moves over the bed carries a heated pressure roller.

The elements of the present invention have particular utility for use in preparing multicolor, multilayer images by a photothermographic transfer process. These are positive working processes, the unexposed areas of the polymer layer which correspond to the image being transferred to form the image on the receiving sheet. However, these elements can also be used to prepare single layer transfers, and they can, if desired, be used in negative working processes in which the unexposed polymer composition is removed from the support leaving a hardened polymer image on the support corresponding to the non-image areas of the original. Such removal of the unexposed areas can be effected by solvent washout with a suitable solvent, such as one of the solvents mentioned above as coating solvents, or it can be effected by thermal stripping wherein the unexposed material is thermally transferred to a cleanout sheet.

The following examples further illustrate this invention.

EXAMPLE 1

A coating formulation is prepared having the following composition:

| | |
|---|---|
| poly(pentamethylene-bis-p-phenylene diacrylate-co-azelate) (37.5:62.5) | 20 grams |
| pigment (Tranzidene Yellow Lemon Shade Pigment YB45 sold by Harmon Colors) | 4 grams |
| plasticizer (a chlorinated biphenyl—Arochlor 1254 sold by Monsanto) | 3 grams |
| 3-ethyl-2-benzoylmethylene naphtho[1,2-d]thiazoline sensitizer | 0.4 gram |
| leveling agent (a copolymer of ethyl acrylate and ethylene — "Modaflow" sold by Mansanto) | 0.1 gram |
| dichloroethane | 86.8 grams |

This is deisgnated Formulation A. Similar formulations, B and C, are prepared with the following modifications:

Formulation B: As in (A) but 0.6 g of corn starch (average particle diameter 10 microns) is added and dichloroethane level is 93.15 g.

Formulation C: As in (A) but 0.4 g of corn starch (average particle diameter 10 microns) is added and dichloroethane level is 90.85 g.

The pigmented compositions are prepared by milling the pigment and about one third of the light sensitive polymer and solvent for 15 hours with one-eighth inch steel balls in a glass bottle on a paint shaker. When the pigment is thoroughly dispersed the steel balls are filtered off and the dispersion is combined with the remaining polymer, solvent and other addenda. The composition is coated on a 4 mil poly(ethylene terephthalate) film support subbed with a terpolymer of vinylidene chloride (80%) acrylonitrile (14%) and acrylic acid (6%) to give a dry thickness of about 0.28 grams per square foot. Each of the matrices is then exposed to an ultraviolet light source through a yellow separation half-tone positive to harden the polymer composition in exposed areas of the matrix. A positive image is prepared by transferring unhardened polymer composition from unexposed areas of the matrix to a baryta-coated paper receiver sheet by placing the matrix and the receiver sheet in face to face contact and passing the sandwich thus formed through a pair of rollers heated to a temperature of about 95° to 110° C and loaded on the ends with a force of 40 pounds per linear inch.

The following results are obtained:

| Formulation | Transfer Image Density (Reflection) | Matrix Tackiness |
|---|---|---|
| A | 1.06 | High |
| B | 1.10 | None |
| C | 1.08 | None |

Similar results are obtained with cyan, magneta and black matrices prepared and tested as above.

EXAMPLE 2

Coating formulations are prepared as described in Example 1 having the following compositions:

Formulation A

| | |
|---|---|
| poly(pentamethylene-bis-p-phenylene dacrylate-co-azelate | 126.0 grams |
| pigment (Tranzidene Yellow Lemon Shade Pigment YB45 sold by Harmon Colors) | 12.60 grams |
| calcium carbonate (OSC-HAKUENKA average particle diameter 12 microns | 31.50 grams |
| 2-benzoylmethylene-3-ethylnaphtho[1,2-d] thiazoline sensitizer | 2.52 grams |
| dichloroethane | 212.00 grams |

Formulation B: As in (A) but 31.50 g of corn starch (average particle diameter 10 microns) is substituted for the calcium carbonate.

Formulation C: As in (A) but 31.50 g of pumice powder (average particle diameter 4 microns) is substituted for the calcium carbonate.

When coated, exposed and transferred as described in Example 1, the following data are obtained:

| Formulation | Feature | Coating Coverage ($g/ft^2$) | Transfer Image Density (Reflection | Matrix Tackiness |
|---|---|---|---|---|
| A | Calcium Carbonate | 1.00 | 0.80* | High |
| B | Corn Starch | 1.00 | 0.88 | None |
| C | Pumice | 1.00 | ** | High |

* Non-uniform due to presence of agglomerates
** Extremely non-uniform due to high repellency by polymer composition

EXAMPLE 3

The following coating formulations are prepared:

Control

| | |
|---|---|
| polymer of Example 1 | 20 grams |
| pigment | 3 grams |
| 2-benzoylmethylene-3-ethylnaphtho[1,2-d]-thiazoline sensitizer | 0.4 grams |
| dichloroethane | 42.5 grams |

Control and corn starch

| | |
|---|---|
| polymer of Example 1 | 20 grams |
| pigment | 3 grams |
| 2-benzoylmethylene-3-ethylnaphto[1,2-d]-thiazoline sensitizer | 0.4 gram |
| corn starch (average particle diameter 10 microns) | 0.6 gram |
| dichloroethane | 50.0 grams |

The pigments utilized in the yellow, magenta and cyan matrices are respectively, Transidene Yellow Lemon Shade YB45; Lithol Rubine Resinate RD9 and Phthalo Blue Green B4790, all sold by Harmon Colors. The formulations are prepared, coated, exposed and transferred as described in Example 1 and the optical density of each of the color transfer prints obtained is read through a red, green or blue filter on a densitometer to yield the following data:

GREEN PATCH

Control

| Filter | Yellow Density+ | Cyan Density= | Additive Green Density | Measured Green Density | % Deviation |
|---|---|---|---|---|---|
| Red | 0.01 | 0.92 | 0.93 | 0.90 | 3.25 |
| Green | 0.06 | 0.32 | 0.38 | 0.38 | 0 |
| Blue | 0.66 | 0.10 | 0.76 | 0.79 | 4% |

Control and Corn Starch

| | | | | | |
|---|---|---|---|---|---|
| Red | 0.01 | 1.19 | 1.20 | 1.20 | 0 |
| Green | 0.08 | 0.47 | 0.55 | 0.55 | 0 |
| Blue | 0.68 | 0.14 | 0.82 | 0.80 | 2.5% |

RED PATCH

Control

| Filter | Yellow Density+ | Magenta Density= | Additive Red Density | Measured Red Density | % Deviation |
|---|---|---|---|---|---|
| Red | 0.01 | 0.10 | 0.11 | 0.11 | 0 |
| Green | 0.06 | 1.06 | 1.12 | 1.04 | 7.1% |
| Blue | 0.66 | 0.63 | 1.29 | 0.97 | 24.9% |

Control and Corn Starch

| Filter | Yellow Density+ | Magenta Density= | Additive Red Density | Measured Red Density | % Deviation |
|---|---|---|---|---|---|
| Red | 0.02 | 0.09 | 0.11 | 0.11 | 0 |
| Green | 0.08 | 0.90 | 0.98 | 0.96 | 2% |
| Blue | 0.68 | 0.54 | 1.22 | 1.08 | 11.5% |

BLUE PATCH

Control

| Filter | Magenta Density+ | Cyan Density= | Additive Blue Density | Measured Blue Density | % Deviation |
|---|---|---|---|---|---|
| Red | 0.10 | 0.92 | 1.02 | 0.94 | 7.8% |
| Green | 1.06 | 0.32 | 1.38 | 1.18 | 14.5% |
| Blue | 0.63 | 0.10 | 0.73 | 0.66 | 9.5% |

Control and Corn Starch

| | | | | | |
|---|---|---|---|---|---|
| Red | 0.09 | 1.19 | 1.28 | 1.24 | 3.1% |
| Green | 0.90 | 0.47 | 1.37 | 1.24 | 9.5% |
| Blue | 0.54 | 0.19 | 0.73 | 0.70 | 4.1% |

This invention has been described with particular reference to certain preferred embodiments thereof, but it will be understood that variations and modifications can be effected within the spirit and scope of the invention.

What is claimed is:

1. A photo sensitive element comprising a support bearing a layer of photosensitive polymer composition comprising a photocrosslinkable polymer containing the light sensitive grouping $$-CH=CH-\overset{\overset{O}{\|}}{C}-$$

corn starch and a pigment chosen from the group consisting of yellow, cyan and magenta pigments, said corn starch has an average particle diameter of 2 to 50 microns and comprising 0.1 to 25 percent by weight of said composition based on the weight of the photocrosslinkage polymer.

2. A photosensitive element as defined in claim 1 wherein the photocrosslinkable polymer is a photocrosslinkable polyester having a tackifying temperature of about 50° C. to 200° C., a glass transition temperature of less than about 30° C., and a crystallinity of about 10 percent to 80 percent as determined by x-ray diffraction, the polyester containing as recurring units:

a. 50 mole percent of at least one dihydric alcohol moiety and b. 50 mole percent of at least two dicarboxylic acid moieties esterified with said dihydric alcohol moiety, about 5 to 45 mole percent of said dicarboxylic acid moieties containing as an integral portion a $$-CH=CH-\overset{\overset{O}{\|}}{C}-$$

grouping.

3. A photosensitive element as defined in claim 2 wherein the dicarboxylic acid moiety containing the $$-CH=CH-\overset{\overset{O}{\|}}{C}-$$

grouping is derived from a p-phenylene diacrylic acid reactant.

4. A photosensitive element as defined in claim 2 wherein the dihydric alcohol moiety is derived from an alcohol having the formula HO-R-OH wherein R is an alkylene radical having two to 12 carbon atoms, the dicarboxylic acid moiety containing the $$-CH=CH-\overset{\overset{O}{\|}}{C}-$$

grouping is derived from a *p*-phenylene diacrylic acid reactant and the remainder of the dicarboxylic acid moieties is derived from a dicarboxylic acid having the formula $$HO\overset{\overset{O}{\|}}{C}-R'-\overset{\overset{O}{\|}}{C}OH$$

or an ester thereof wherein R' is selected from the group consisting of alkylene radicals having two to 12 carbon atoms and phenylene radicals.

5. A photosensitive element comprising a support bearing a layer of a pigmented photosensitive polymer composition comprising the photocrosslinkable polymer poly(pentamethylene-bis-*p*-phenylene diacrylate-co-azelate) and from one to 15 percent by weight, based on the weight of the polymer, of corn starch having an average particle diameter of two to 50 microns, with the major portion of the particles having a diameter of three to 15 microns.

* * * * *

UNITED STATES PATENT OFFICE
CERTIFICATE OF CORRECTION

Patent No. 3,775,112 Dated November 27, 1973

Inventor(s) Michael J. Alsup and Alec N. Mutz

It is certified that error appears in the above-identified patent and that said Letters Patent are hereby corrected as shown below:

Col. 3, lines 11 and 12, "now abandoned" should read ---now U.S. Patent 3,674,745---.

Col. 7, line 60, "deisgnated" should read ---designated---.

Col. 8, line 59, "(Reflection" should read ---(Reflection)---.

Col. 10, line 16, Claim 1, "cross-linkage" should read---cross-linkable---.

Signed and sealed this 6th day of August 1974.

(SEAL)
Attest:

McCOY M. GIBSON, JR.
Attesting Officer

C. MARSHALL DANN
Commissioner of Patents